(12) United States Patent
Shin et al.

(10) Patent No.: US 7,778,089 B2
(45) Date of Patent: Aug. 17, 2010

(54) SEMICONDUCTOR MEMORY DEVICE INCLUDING WRITE DRIVER CONTROL CIRCUIT AND WRITE DRIVER CONTROL METHOD

(75) Inventors: Sang Hoon Shin, Kyoungki-do (KR); Seung Wook Kwack, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 302 days.

(21) Appl. No.: 11/775,313

(22) Filed: Jul. 10, 2007

(65) Prior Publication Data

US 2008/0080278 A1    Apr. 3, 2008

(30) Foreign Application Priority Data

Sep. 29, 2006   (KR) .................. 10-2006-0096606
Feb. 14, 2007   (KR) .................. 10-2007-0015567

(51) Int. Cl.
*G11C 7/10*   (2006.01)

(52) U.S. Cl. .................. 365/189.05; 365/189.011; 365/194; 365/203

(58) Field of Classification Search ............ 365/189.05, 365/189.011, 189.08, 189.16, 194, 203
See application file for complete search history.

(56) References Cited

U.S. PATENT DOCUMENTS 6,320,806 B1 *  11/2001  Han ........................... 365/203
6,333,959 B1    12/2001  Lai et al.
7,263,026 B2 *   8/2007  Kim et al. .............. 365/233.16
2001/0014046 A1 *  8/2001  Sakamoto .................... 365/205
2003/0007403 A1 *  1/2003  Kitamoto et al. ............ 365/205
2005/0257121 A1 * 11/2005  Kim et al. .................... 714/768

FOREIGN PATENT DOCUMENTS

| KR | 1019970008174 A | 5/1997 |
| KR |     19990048857 A | 7/1999 |
| KR |     2001-0021253 A | 3/2001 |
| KR |     2001-0059017 A | 7/2001 |
| KR | 1020060027972 A | 3/2006 |
| KR | 1020060054613 A | 5/2006 |

* cited by examiner

*Primary Examiner*—Tuan T Nguyen
*Assistant Examiner*—Toan Le
(74) *Attorney, Agent, or Firm*—Ladas & Parry LLP

(57) ABSTRACT

A write driver control circuit controls operations of a write driver, which amplifies and transmits data of a pair of global input/output lines to a pair of local input/output lines in a write operation. A single type latch section compares states of first and second data of the pair of global input/output lines differentially inputted in a first status and then outputs a first output signal to a first output node; compares states of the first and second data differentially inputted in a second status and then outputs a second output signal to a second output node; and continuously latches states of the first and second output nodes before a precharge operation starts. A precharge controller equalizes and precharges the first and second output nodes in the precharge operation. An output section outputs first and second driver signals and first and second latch signals to control the write driver.

21 Claims, 9 Drawing Sheets

FIG.5
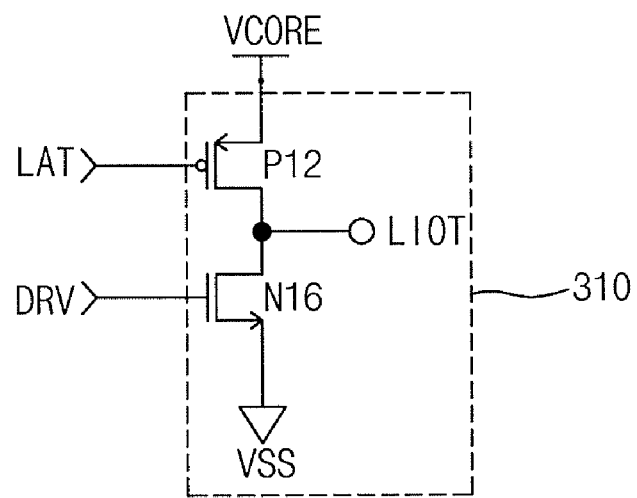
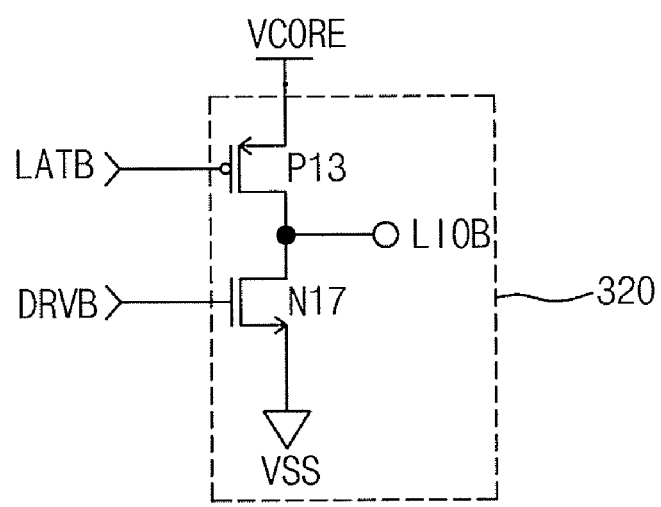

SEMICONDUCTOR MEMORY DEVICE INCLUDING WRITE DRIVER CONTROL CIRCUIT AND WRITE DRIVER CONTROL METHOD

CROSS-REFERENCE TO RELATED APPLICATIONS

The present application claims priority to patent application number 10-2006-0096606 filed on Sep. 26, 2006, which is incorporated herein by reference in its entirety.

BACKGROUND OF THE INVENTION

The present invention relates to a semiconductor memory device, and more particularly to a method and circuit for controlling a write driver, which amplifies data inputted from an exterior and provides the amplified data to a memory cell in a write operation.

As generally known in the art, a semiconductor memory device includes a write driver, which amplifies data inputted from an exterior and transmits the amplified data to a local input/output line in a write operation. The operation of such a write driver is controlled by a write driver control circuit as shown in FIG. 1.

In detail, as shown in FIG. 1, a write driver control circuit 10 includes four latch units 11 to 14, and a write driver 20 includes two driver units 21 and 22. The constructions and operations of the write driver control circuit 10 and write driver 20 will now be described with reference to FIGS. 1 and 2.

The first latch unit 11 may include PMOS transistor P1, NMOS transistor N1, NMOS transistor N2, and two inverters INV1 and INV2. The PMOS transistor P1 is turned on by data transferred from a global input/output bar line GIOB and configured to raise the voltage of node ND1 to the level of a power supply voltage VDD. The NMOS transistor N1 is turned on by the data transferred from the global input/output bar line GIOB and configured to connect the node ND1 with the NMOS transistor N2. The NMOS transistor N2 is turned on by a write driver enable signal BWEN and configured to lower the voltage of the node ND1 to the level of a ground voltage VSS. The inverters INV1 and INV2 latch data transferred to the node ND1, and output the latched data DATA_LATB.

The first latch unit 11 having such a construction latches data transferred from the global input/output bar line GIOB by using the write driver enable signal BWEN, thereby securing a timing margin for data transmission.

The second latch unit 12 may include PMOS transistor P2, NMOS transistor N3, NMOS transistor N4, and two inverters INV3 and INV4. The PMOS transistor P2 is turned on by data transferred from a global input/output true line GIOT and configured to raise the voltage of node ND2 to the level of the power supply voltage VDD. The NMOS transistor N3 is turned on by the data transferred from the global input/output true line GIOT and configured to connect the node ND2 with the NMOS transistor N4. The NMOS transistor N4 configured to lower the voltage of the node ND2 to the level of the ground voltage VSS by using the write driver enable signal BWEN. The inverters INV3 and INV4 latch data transferred to the node ND2, and output the latched data DATA_LAT.

The second latch unit 12 having such a construction latches data transferred from the global input/output true line GIOT by using the write driver enable signal BWEN, thereby securing a timing margin for data transmission.

The third latch unit 13 may include PMOS transistor P3, NMOS transistor N5, NMOS transistor N6, and inverters INV5, INV6, INV7 and INV8. The PMOS transistor P3 is turned on by a precharge control signal PCG and configured to raise the voltage of node ND3 to the level of the power supply voltage VDD. The NMOS transistor N5 is turned on by a delayed write driver enable signal DBWEN, which has been delayed to be enabled at a point of time when the latched data DATA_LATB and DATA_LAT are outputted, and configured to connect the node ND3 with the NMOS transistor N6. The NMOS transistor N6 is turned on by the latched data DATA_LATB and configured to lower the voltage of the node ND3 to the level of the ground voltage VSS. The inverters INV5 and INV6 latch data transferred to the node ND3 and output the latched data PRE_DRV. The inverters INV7 and INV8 invert and delay the latched data PRE_DRV and output an inverted latch signal LATB and a driver signal DRV, respectively.

The third latch unit 13 having such a construction latches data transferred to the node ND3 by using the delayed write driver enable signal DBWEN, the precharge control signal PCG, and the signal DATA_LATB outputted from the first latch unit 11, thereby generating the inverted latch signal LATB and driver signal DRV to control the operation of the write driver.

The fourth latch unit 14 may include PMOS transistor P4, NMOS transistor N7, NMOS transistor N8, and inverters INV9, INV10, INV11 and INV12. The PMOS transistor P4 is turned on by the precharge control signal PCG and configured to raise the voltage of node ND4 to the level of the power supply voltage VDD. The NMOS transistor N7 is turned on by the delayed write driver enable signal DBWEN and configured to connect the node ND4 with the NMOS transistor N8. The NMOS transistor N8 is turned on by the latched data DATA_LATB and configured to lower the voltage of the node ND4 to the level of the ground voltage VSS. The inverters INV9 and INV10 latch data transferred to the node ND4 and output the latched data PRE_DRVB. The inverters INV11 and INV12 invert and delay the latched data PRE_DRVB, and output a latch signal LAT and an inverted driver signal DRVB, respectively.

The fourth latch unit 14 having such a construction latches data transferred to the node ND4 by using the delayed write driver enable signal DBWEN, the precharge control signal PCG, and the signal DATA_LAT outputted from the second latch unit 12, thereby the fourth latch unit 14 is configured to generate the latch signal LAT and inverted driver signal DRVB to control the operation of the write driver.

The first driver unit 15 may include PMOS transistor P5 and NMOS transistor N9. The PMOS transistor P5 is turned on by the latch signal LAT and configured to raise the voltage of a local input/output true line LIOT to the level of a core voltage VCORE, and the NMOS transistor N9 is turned on by the driver signal DRV and configured to lower the voltage of the local input/output true line LIOT to the level of the ground voltage VSS.

The first driver unit 21 having such a construction amplifies and transmits data of the global input/output true line GIOT to the local input/output true line LIOT, by using the latch signal LAT and driver signal DRV.

The second driver unit 22 may include PMOS transistor P6 and NMOS transistor N17. The PMOS transistor P6 is turned on by the inverted latch signal LATB and configured to raise the voltage of a local input/output bar line LIOB to the level of the core voltage VCORE; and the NMOS transistor N17 is turned on by the inverted driver signal DRVB and configured to lower the voltage of the local input/output bar line LIOB to the level of the ground voltage VSS.

The second driver unit 22 having such a construction amplifies and transmits data of the global input/output bar line GIOB to the local input/output bar line LIOB, by using the inverted latch signal LATB and inverted driver signal DRVB.

As described above, the write driver control circuit 10 of FIG. 1 latches data of a pair of global input/output lines GIOT and GIOB; and the write driver 20 drives a pair of local input/output lines LIOT and LIOB by using the signals LAT, PRV, LATB and PRVB outputted from the write driver control circuit 10.

However, because the write driver control circuit 10 generates the signals LAT, PRV, LATB and PRVB to control the operation of the write driver 20 by latching data of the pair of global input/output lines GIOT and GIOB through the four latch units 11 to 14, an area occupied by the write driver control circuit 10 may require a burdensome increase in a semiconductor memory device.

In addition, since the write driver control circuit 10 as shown in FIG. 1 controls the write driver 20 by latching data transmitted from the pair of global input/output lines GIOT and GIOB through four latch units 11 to 14, there is a potential problem in that a large amount of current may be consumed due to such a latching operation in a write operation.

SUMMARY OF THE INVENTION

Accordingly, the present invention has been made to address the above-mentioned and other problems occurring in the prior art, and the present invention provides advantageous techniques to reduce the area occupied by a write driver control circuit in a semiconductor memory device.

The present invention provides novel ways to reduce current consumption due to a write driver control circuit in a write operation.

In order to accomplish these, the present invention provides a write driver control circuit including: a single type latch section configured to compare first and second data of a pair of global input/output lines and then outputting a first output signal to a first output node and a second output signal to a second output node; and an output section configured to output first and second driver signals and first and second latch signals configured to control a write driver, by using the first and second output signals.

Preferably, in a construction of the write driver control circuit, the single type latch section continuously latches states of the first and second output nodes before a precharge operation starts. Particularly, it is preferred that the single type latch section has a cross-coupled latch structure to output the first and second output signals by comparing electric potentials of the first and second data, and to latch states of the first and second output nodes.

Preferably, in a construction of the write driver control circuit, the single type latch section includes: a pull-down component which is turned on by a write driver control signal enabled in the write operation and pulls down an electric potential of a common node to a ground voltage level; a first switch which is turned on by the first data and connects a first node with the common node; a second switch which is turned on by the second data and connects a second node with the common node; a first pull-up component which is turned on by an electric potential of the second output node and pulls up an electric potential of the first output node to a power supply voltage level; a third switch which is turned on by the electric potential of the second output node and connects the first output node with the first node; a second pull-up component which is turned on by the electric potential of the first output node and pulls up the electric potential of the second output node to the power supply voltage level; and a fourth switch which is turned on by the electric potential of the first output node and connects the second output node with the second node, wherein the single type latch section outputs the driver control signals through the first and second output nodes.

Preferably, in a construction of the write driver control circuit, the output section includes: a first inverter for inverting the first output signal and outputting the inverted first output signal as the first driver signal; a second inverter for inverting the first driver signal and outputting the inverted first driver signal as the first latch signal; a third inverter for inverting the second output signal and outputting the inverted second output signal as the second driver signal; and a fourth inverter for inverting the second driver signal and outputting the inverted second driver signal as the second latch signal.

Also, preferably, the output section further includes a latch component configured to individually latch the first and second output signals during a write operation.

Preferably, in a construction of the output section, the latch component includes: a first combination component configured to combine the first output signal and a latch control signal maintained in an enable state during the write operation; a second pull-down component which is turned on by a signal output from the first combination component and pulls down the electric potential of the first output node to a ground voltage level; a second combination component configured to combine the second output signal and the latch control signal; and a third pull-down component which is turned on by a signal output from the second combination component and pulls down the electric potential of the second output node to a ground voltage level.

Meanwhile, more preferably, the write driver control circuit further includes a precharge controller configured to equalize and precharge the first and second output nodes in the precharge operation.

Preferably, in a construction of the write driver control circuit, the precharge controller includes: a third pull-up component which is turned on by a precharge control signal enabled in the precharge operation and pulls up an electric potential of the first output node to a power supply voltage level; a fourth pull-up component which is turned on by the precharge control signal and pull up an electric potential of the second output node to the power supply voltage level; and a fifth switch which is turned on by the precharge control signal and equalizes the first output node with the second output node.

In accordance with another aspect of the present invention, there is provided a semiconductor memory device including: a buffer unit for buffering and transmitting data, which have been inputted from an exterior, to a pair of global input/output lines; a single type latch-based write driver control unit configured to sense and amplify a potential difference between data which have been transferred from the pair of global input/output lines, and output driver control signals; a write driver for driving a pair of local input/output lines by using the driver control signals; and a column selection unit for transmitting data of the pair of local input/output lines to a corresponding pair of bit lines.

Preferably, in a construction of the semiconductor memory device, the single type latch-based write driver control unit continuously latches states of the driver control signals before a precharge operation starts, and precharging the driver control signals in the precharge operation.

Preferably, in a construction of the semiconductor memory device, the single type latch-based write driver control unit includes: a single type latch section for, in a write operation, comparing states of first and second data of the pair of global input/output lines having been differentially inputted in a first status and then outputting a first output signal to a first output node, comparing states of the first and second data having been differentially inputted in a second status and then outputting a second output signal to a second output node, and continuously latching states of the first and second output nodes before the precharge operation starts; a precharge controller for equalizing and precharging the first and second output nodes in the precharge operation; and an output section for outputting first and second driver signals and first and second latch signals as the write driver control signals, by using the first and second output signals.

Preferably, in a construction of the single type latch-based write driver control unit, the single type latch section has a cross-coupled latch structure to output the first and second output signals by comparing electric potentials of the first and second data, and to latch states of the first and second output nodes.

Preferably, in a construction of the single type latch-based write driver control unit, the single type latch section includes: a first pull-down component which is turned on by a write driver control signal enabled in the write operation and pulls down an electric potential of a common node to a ground voltage level; a first switch which is turned on by the first data and connects a first node with the common node; a second switch which is turned on by the second data and connects a second node with the common node; a first pull-up component which is turned on by an electric potential of the second output node and pulls up an electric potential of the first output node to a power supply voltage level; a third switch which is turned on by the electric potential of the second output node and connects the first output node with the first node; a second pull-up component which is turned on by the electric potential of the first output node and pulls up the electric potential of the second output node to the power supply voltage level; and a fourth switch which is turned on by the electric potential of the first output node and connects the second output node with the second node, wherein the single type latch section outputs the driver control signals through the first and second output nodes.

Preferably, in a construction of the single type latch-based write driver control unit, the precharge controller includes: a third pull-up component which is turned on by a precharge control signal enabled in the precharge operation and pulls up an electric potential of the first output node to a power supply voltage level; a fourth pull-up component which is turned on by the precharge control signal and pulls up an electric potential of the second output node to the power supply voltage level; and a fifth switch which is turned on by the precharge control signal and equalizes the first output node with the second output node.

Preferably, in a construction of the single type latch-based write driver control unit, the output section includes: a first inverter for inverting the first output signal and outputting the inverted first output signal as the first driver signal; a second inverter for inverting the first driver signal and outputting the inverted first driver signal as the first latch signal; a third inverter for inverting the second output signal and outputting the inverted second output signal as the second driver signal; and a fourth inverter for inverting the second driver signal and outputting the inverted second driver signal as the second latch signal.

Also, preferably, the output section further includes a latch component configured to individually latch the first and second output signals during a write operation.

Preferably, in a construction of the output section, the latch component includes: a first combination component configured to combine the first output signal and a latch control signal maintained in an enable state during the write operation; a second pull-down component which is turned on by a signal output from the first combination component and pulls down the electric potential of the first output node to a ground voltage level; a second combination component configured to combine the second output signal and the latch control signal; and a third pull-down component which is turned on by a signal output from the second combination component and pulls down the electric potential of the second output node to a ground voltage level.

Preferably, in a construction of the semiconductor memory device, the write driver includes: a second pull-down component which is turned on by the first driver signal and pulls down a first local input/output line of the pair of local input/output lines to a ground voltage level; a fifth pull-up component which is turned on by the first latch signal and pulls up the first local input/output line to a power supply voltage level; a sixth pull-up component which is turned on by the second driver signal and pulls up a second local input/output line of the pair of local input/output lines to the power supply voltage level; and a third pull-down component which is turned on by the second latch signal and pulls downs the second local input/output line to the ground voltage level.

In accordance with still another aspect of the present invention, there is provided a method for controlling a write driver, the method including the steps of: (1) comparing states of first and second data of the pair of global input/output lines, which have been differentially inputted in the write operation and have a first status, and outputting a first output signal to a first output node; (2) comparing states of the first and second data which have been differentially inputted and have a second status, and outputting a second output signal to a second output node; (3) continuously latching states of the first and second output nodes before a precharge operation starts; (4) equalizing and precharging the first and second output nodes in the precharge operation; and (5) controlling the write driver by using the first and second output signals.

Preferably, in step 1, first data of a high level and second data of a low level, which are data in the first status, are compared with each other and the first output signal is outputted; and first data of a low level and second data of a high level, which are data in the second status, are compared with each other, and the second output signal is outputted.

BRIEF DESCRIPTION OF THE DRAWINGS

The above and other objects, features and advantages of the present invention will be more apparent from the following detailed description taken in conjunction with the accompanying drawings, in which:

FIG. 5 is a circuit diagram illustrating the construction of the write driver (300) shown in FIG. 3;

DETAILED DESCRIPTION OF THE PREFERRED EMBODIMENTS

Figure 1:
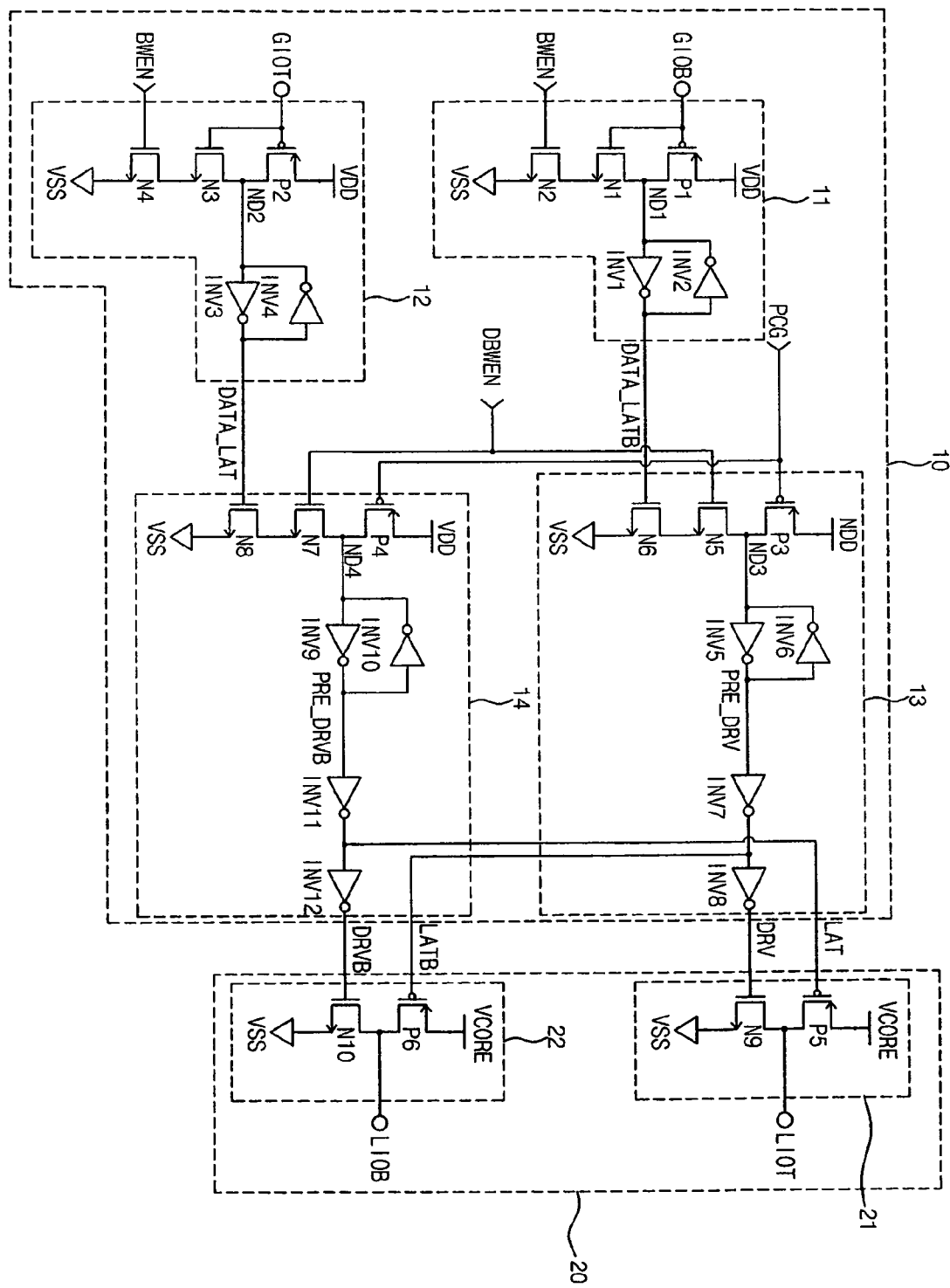
FIG. 1 is a circuit diagram illustrating the construction of a conventional write driver control circuit (10) and write driver (20)
Figure 2:
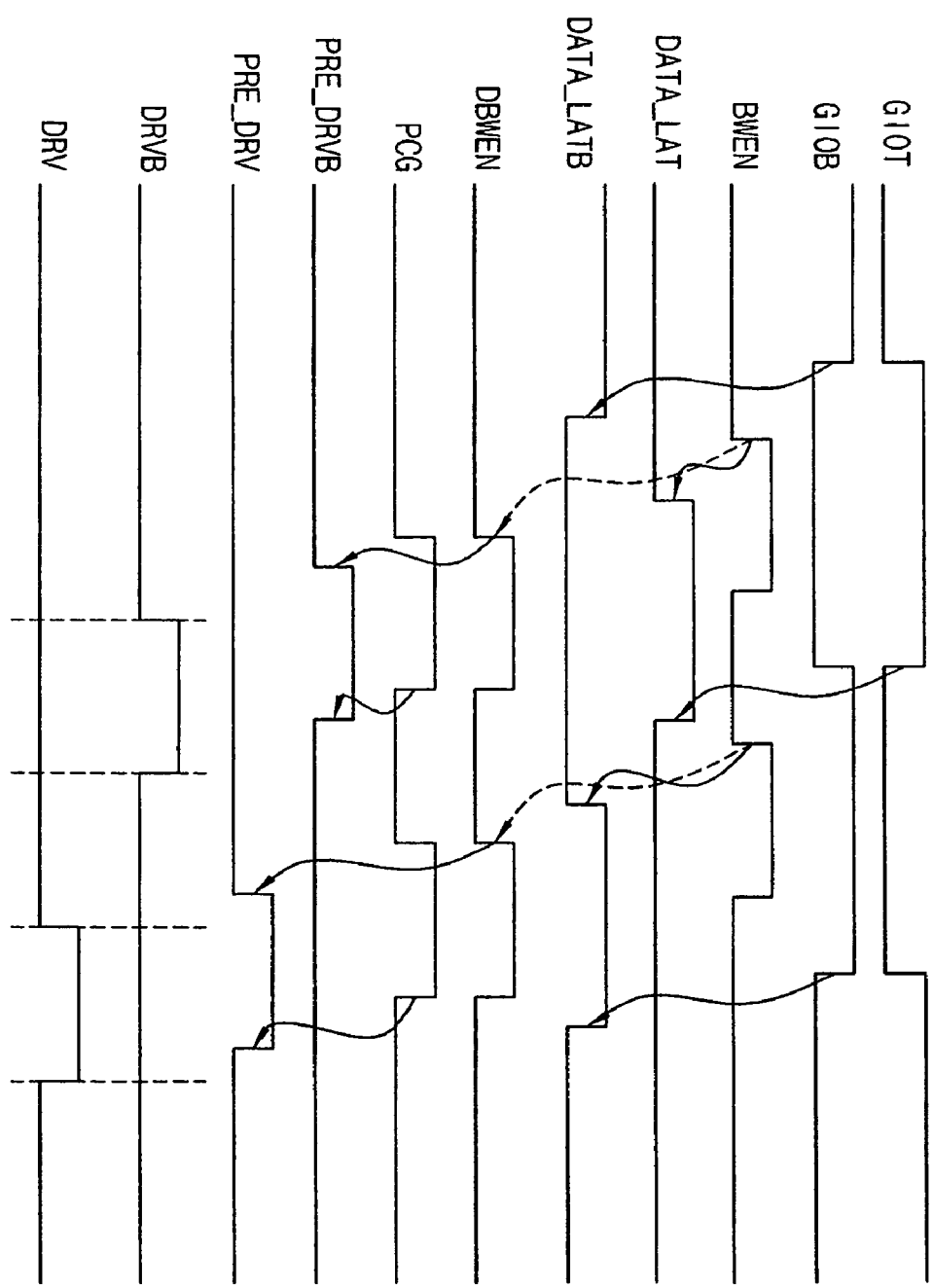
FIG. 2 is a waveform view for explaining the operation of the circuit shown in FIG. 1.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
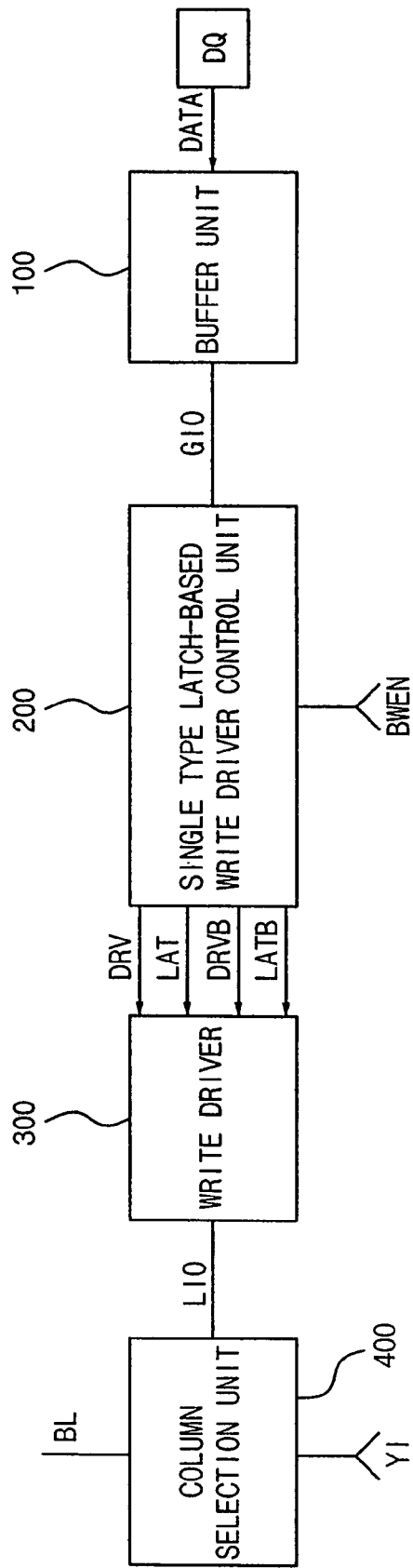
FIG. 3 is a circuit diagram illustrating the construction of a semiconductor memory device, which includes a single-type latch-based write driver control unit (200) according to an embodiment of the present invention.

An embodiment of the present invention is shown in FIG. 3, in which a circuit 200 for controlling a write driver 300 has a single type latch structure.

In detail, an embodiment of the present invention shown in FIG. 3 includes a buffer unit 100, a single type latch-based write driver control unit 200, a write driver 300, and a column selection unit 400.

The buffer unit 100 buffers DATA inputted from an exterior and transmits the buffered DATA to a global input/output line GIO.

The single type latch-based write driver control unit 200 amplifies data transferred from the global input/output line GIO, and outputs signals DRV, LAT, DRVB and LATB to control the write driver, in a write operation. In this case, the single type latch-based write driver control unit 200 continuously latches the states of the signals DRV, LAT, DRVB and LATB before a precharge operation starts, and precharges the signals DRV, LAT, DRVB and LATB in the precharge operation.

Figure 4:
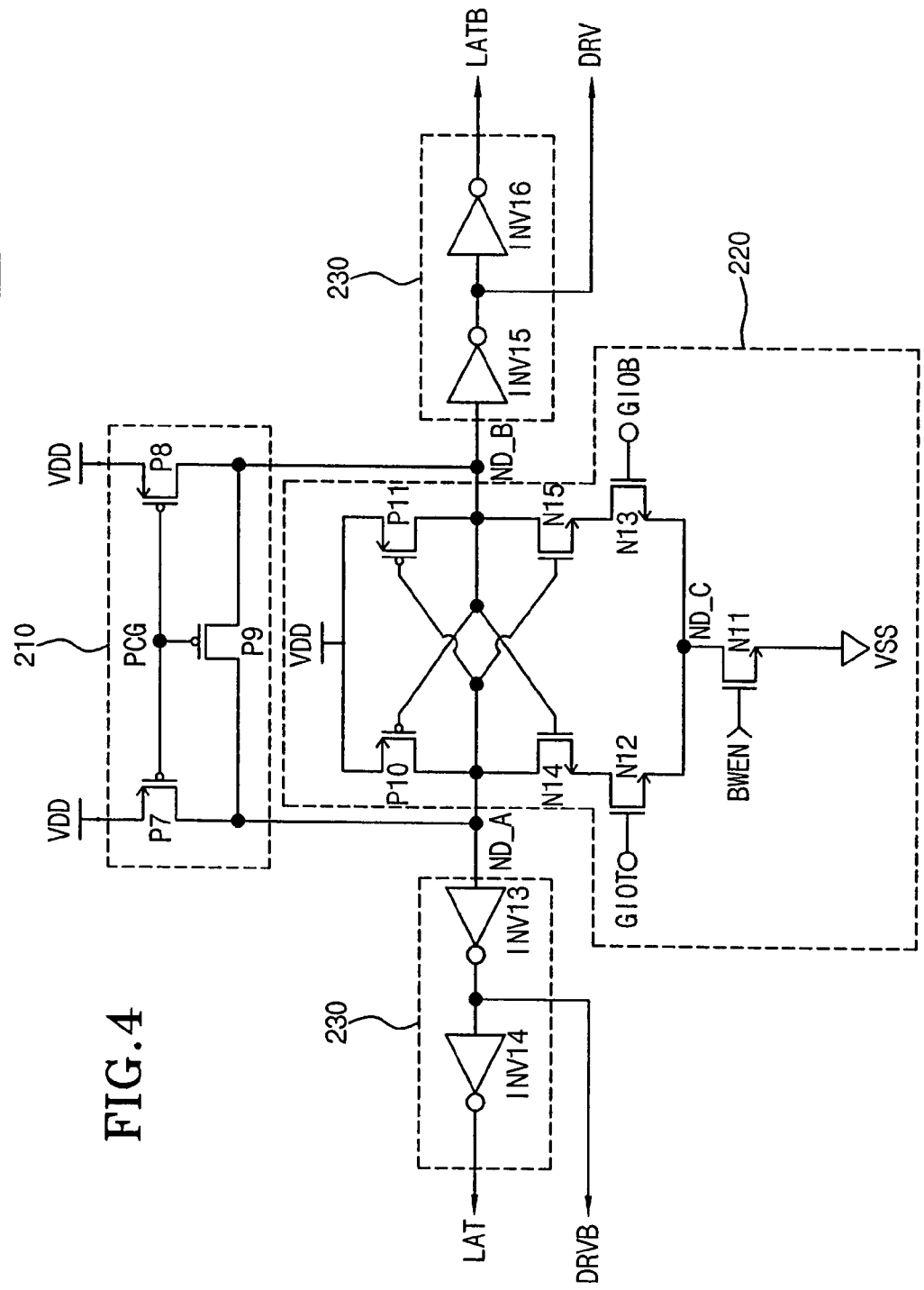
FIG. 4 is a circuit diagram illustrating the construction of the single-type latch-based write driver control unit (200) shown in FIG. 3.
Figure 6:
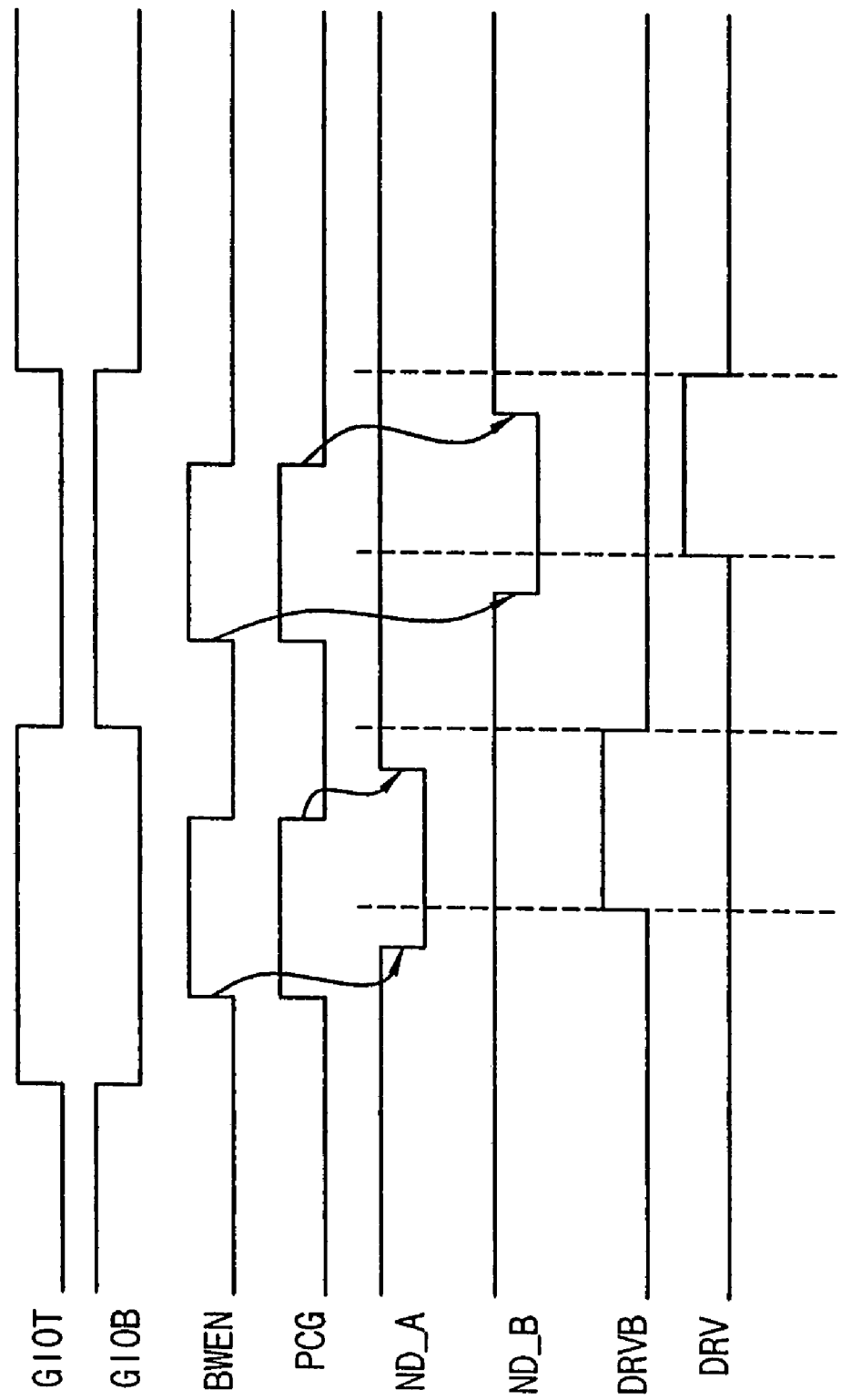
FIG. 6 is a waveform view for explaining the operation of the single-type latch-based write driver control unit (200) shown in FIG. 4 and the operation of the write driver (300) shown in FIG. 5.

Such a single type latch-based write driver control unit 200 may include, as shown in FIG. 4, a precharge controller 210, a single type latch section 220, and an output section 230.

Herein, the precharge controller 210 may include two pull-up components and one switch. Preferably, each of the pull-up components includes PMOS transistor P7 and PMOS transistor P8, and the switch includes PMOS transistor P9. The PMOS transistor P7 is turned on by a precharge control signal PCG and raises the voltage of node ND_A to the level of the power supply voltage VDD. The PMOS transistor P8 is turned on by the precharge control signal PCG and raises the voltage of node ND_B to the level of the power supply voltage VDD. The PMOS transistor P9 is turned on by the precharge control signal PCG and connects the node ND_A with the node ND_B.

The single type latch section 220 may include one pull-down component, four switches and two pull-up components. Preferably, the pull-down component includes NMOS transistor N11, and each of the switch includes NMOS transistor N12, NMOS transistor N13, NMOS transistor N14 and NMOS transistor N15, and each of the pull-up components includes PMOS transistor P10 and PMOS transistor P11. The NMOS transistor N11 is turned on by a write driver enable signal BWEN and lowers the voltage of node ND_C to the level of a ground voltage VSS. The NMOS transistor N12 is turned on by data transferred from a global input/output true line GIOT and connects the NMOS transistor N11 with the NMOS transistor N14. The NMOS transistor N13 is turned on by data transferred from a global input/output bar line GIOB and connects the NMOS transistor N11 with the NMOS transistor N15. The NMOS transistor N14 is turned on by the electric potential of node ND_B and connects the NMOS transistor N12 with the PMOS transistor P10. The PMOS transistor P10 is turned on by the electric potential of the node ND_B and raises the voltage of the node ND_A to the level of the power supply voltage VDD. The NMOS transistor N15 is turned on by the electric potential of the node ND_A and connects the NMOS transistor N13 with the PMOS transistor P11. The PMOS transistor P11 is turned on by the electric potential of the node ND_A and raises the voltage of the node ND_B to the level of the power supply voltage VDD.

The output section 230 may include inverter INV13, inverter INV14, inverter INV15 and inverter INV16. The inverter INV13 inverts the electric potential of the node ND_A, thereby outputting an inverted driver signal DRVB. The inverter INV14 inverts the inverted driver signal DRVB outputted from the inverter INV13, thereby outputting a latch signal LAT. The inverter INV15 inverts the electric potential of the node ND_B, thereby outputting a driver signal DRV. The inverter INV16 inverts the driver signal DRV outputted from the inverter INV15, thereby outputting an inverted latch signal LATB.

The write driver 300 includes, as shown in FIG. 5, a local input/output true line driver section 310 and a local input/output bar line driver section 320.

Herein, the local input/output true line driver section 310 may include one pull-up component and one pull-down component. Preferably, the pull-up component includes PMOS transistor P12 and the pull-down component includes NMOS transistor N16, in which the PMOS transistor P12 is turned on by a driver control signal LAT and raises the voltage of a local input/output true line LIOT to the level of a core voltage VCORE, which is a memory cell voltage, and the NMOS transistor N16 is turned on by a driver control signal DRV and lowers the voltage of the local input/output true line LIOT to the level of the ground voltage VSS.

Also, the local input/output bar line driver section 320 may include one pull-up component and one pull-down component. Preferably, the pull-up component includes PMOS transistor P13 and the pull-down component includes NMOS transistor N17, in which the PMOS transistor P13 is turned on by a driver control signal LATB and raises the voltage of a local input/output bar line LIOB to the level of the core voltage VCORE, which is a memory cell voltage, and the NMOS transistor N17 is turned on by a driver control signal DRV and lowers the voltage of the local input/output bar line LIOB to the level of the ground voltage VSS.

Meanwhile, the column selection unit 400 transmits data of the local input/output line LIO to a bit line BL by using a column selection signal YI.

The operation of the semiconductor memory device having such a construction according to an embodiment of the present invention will be described in detail with reference to FIGS. 3 to 6.

First, in a precharge operation, the PMOS transistors P7 to P9 are all turned on by a precharge control signal PCG, the nodes ND_A and ND_B are precharged to the level of the power supply voltage VDD.

Thereafter, in a write operation, the NMOS transistor N11 is turned on by the write driver control signal BWEN, and according to an embodiment of the present invention, the electric potential difference between data transferred from a pair of global input/output lines GIO and GIOB is sensed, amplified and latched.

For example, when high-level data are transmitted from the global input/output true line GIOT and low-level data are transmitted from the global input/output bar line GIOB, the NMOS transistor N12 is turned on and the NMOS transistor N13 is turned off.

When the NMOS transistor N12 is turned on, a current path is formed from the node ND_A to the line of the ground voltage VSS via the NMOS transistors N14, N12, and N11, so that the electric potential of the node ND_A is lowered to the level of the ground voltage VSS.

In addition, when the NMOS transistor N13 is turned off, a current path from the node ND_B to the ground voltage VSS is not formed, so that the electric potential of the node ND_B is maintained at the level of the core voltage VCORE.

Accordingly, the driver control signal DRVB goes into a high level and thus the PMOS transistor P12 of the local input/output true line driver section 210 is turned on, so that the voltage of the local input/output true line LIOT is raised to the level of the core voltage VCORE.

In addition, the driver control signal DRV goes into a low level and thus the NMOS transistor N17 of the local input/output bar line driver section 220 is turned on, so that the voltage of the local input/output bar line LIOB is lowered to the level of the ground voltage VSS.

In contrast, when low-level data are transmitted from the global input/output true line GIOT and high-level data are transmitted from the global input/output bar line GIOB, the electric potential of the node ND_A is maintained at the level of the power supply voltage VDD, and the electric potential of the node ND_B is lowered to the level of the ground voltage VSS.

Accordingly, the driver control signal DRVB goes into a low level, and thus the NMOS transistor N16 of the local input/output true line driver section 310 is turned on, so that the voltage of the local input/output true line LIOT is lowered to the level of the ground voltage VSS.

In addition, the driver control signal DRV goes into a high level, and thus the PMOS transistor P13 of the local input/output bar line driver section 320 is turned on, so that the voltage of the local input/output bar line LIOB is raised to the level of the core voltage VCORE.

Meanwhile, the electric potentials of the nodes ND_A and ND_B are continuously latched with a constant value according to the operations of the PMOS transistors P10 and P11 and NMOS transistors N14 and 15 before the precharge control signal PCG is enabled.

Thereafter, when the precharge control signal PCG is enabled, the PMOS transistors P7 to P9 are all turned on, so that the voltages of the nodes ND_A and ND_B are again precharged to the level of the power supply voltage VDD.

As described above, according to an embodiment of the present invention, in order to transmit data inputted from an exterior to a memory cell in a write operation, a timing margin for data is secured through the single type latch-based write driver control unit 200, and the operation of the write driver 300 is controlled.

Herein, the single type latch section 210 of the single type latch-based write driver control unit 200 may have a cross-coupled structure to compare, amplify and latch data transmitted from a pair of global input/output lines GIO and GIOB.

Therefore, the single type latch-based write driver control unit 200 according to an embodiment of the present invention has a smaller area than that of the conventional write driver control circuit 10 as shown in FIG. 1, thereby reducing the area occupied by the write driver control unit in a semiconductor memory device.

Also, according to an embodiment of the present invention, in a write operation, data are latched at the same time through the PMOS transistors P10 and P11 and NMOS transistors N14 and 15, which are configured in a cross-coupled structure, thereby reducing current consumption for a latch operation as compared with that of the conventional write driver control circuit.

In addition, according to an embodiment of the present invention, it is unnecessary to use a delayed write driver enable signal DBWEN in a latch operation, which has been required in the conventional circuit as shown in FIG. 1. As a result, it is possible to reduce the wasteful current consumption and area occupancy due to use of the delayed write driver enable signal DBWEN.

Figure 7:
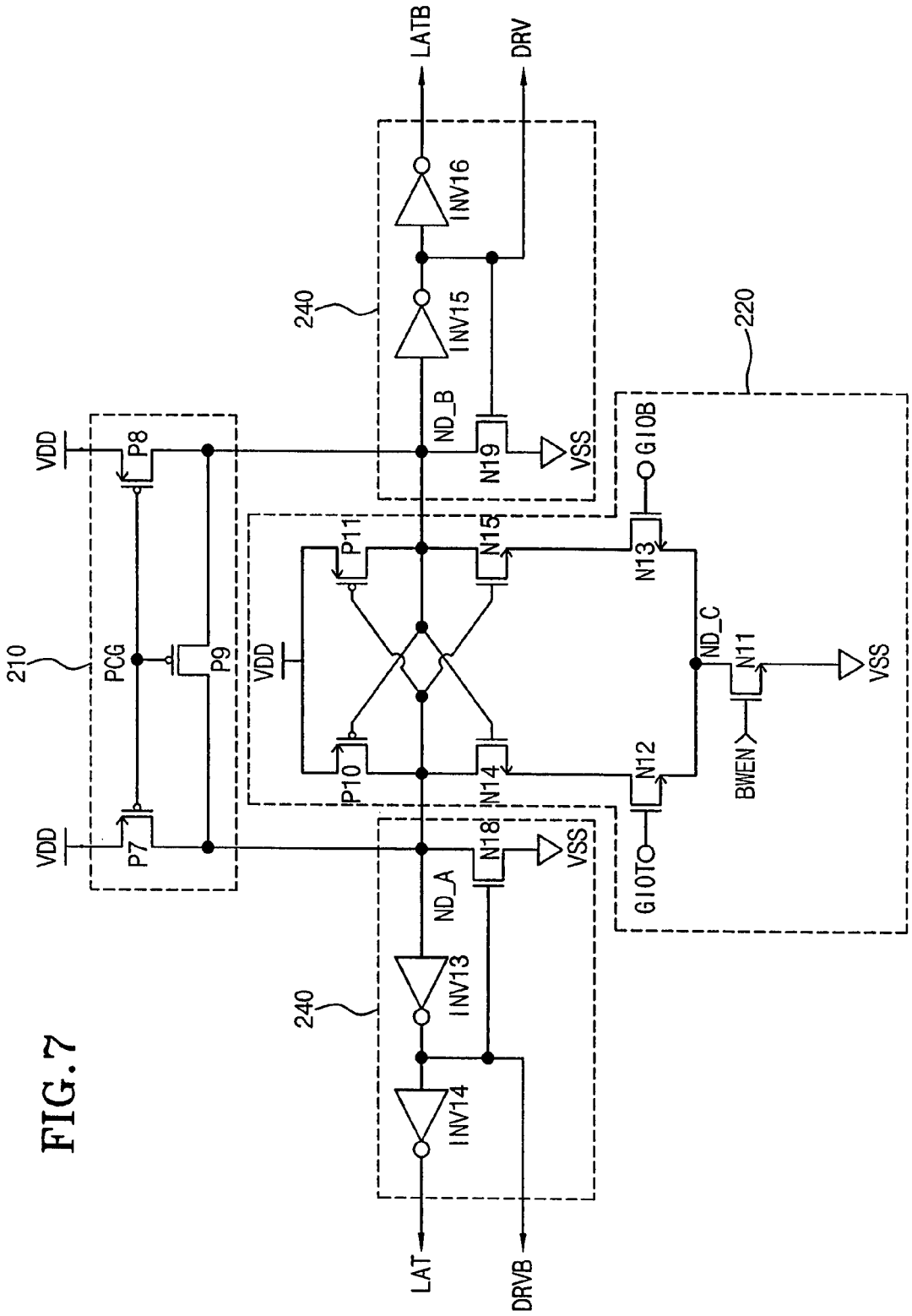
FIG. 7 is a circuit diagram illustrating another example of the construction of the single-type latch-based write driver control unit (200) shown in FIG. 3.

Meanwhile, the single type latch-based write driver control unit 200 may be configured as shown in FIG. 7 according to another embodiment of the present invention.

In detail, the single type latch-based write driver control unit 200 of FIG. 7 has a construction such that a latch-based output section 240 is connected to the output nodes ND_A and ND_B of the single type latch section 220, in addition to the construction of the precharge controller 210 and single type latch section 220 of FIG. 4.

Herein, the latch-based output section 240 may include inverter INV13, inverter INV14, inverter INV15, inverter INV16 and two pull-down component. Preferably, each of the pull-up components includes NMOS transistor N18 and NMOS transistor N19. The inverter INV13 inverts the electric potential of the node ND_A, thereby outputting an inverted driver signal DRVB. The NMOS transistor N18 is turned on by the inverted driver signal DRVB and lowers the electric potential of the node ND_A to the level of the ground voltage VSS. The inverter INV14 inverts the inverted driver signal DRVB outputted from the inverter INV13, thereby outputting a latch signal LAT. The inverter INV15 inverts the electric potential of the node ND_B, thereby outputting a driver signal DRV. The NMOS transistor N19 is turned on by the driver signal DRV and lowers the electric potential of the node ND_B to the level of the ground voltage VSS. The inverter INV16 inverts the driver signal DRV outputted from the inverter INV15, thereby outputting an inverted latch signal LATB.

According to the latch-based output section 240 having such a construction, when the write driver enable signal BWEN is delayed and input, and is thus maintained in an enable state at a point of time at which the levels of the global input/output lines GIOT and GIOB are transited, the electric potentials of the output nodes ND_A of ND_B of the single type latch section 220 are latched, thereby preventing the nodes ND_A of ND_B from floating.

Figure 8:
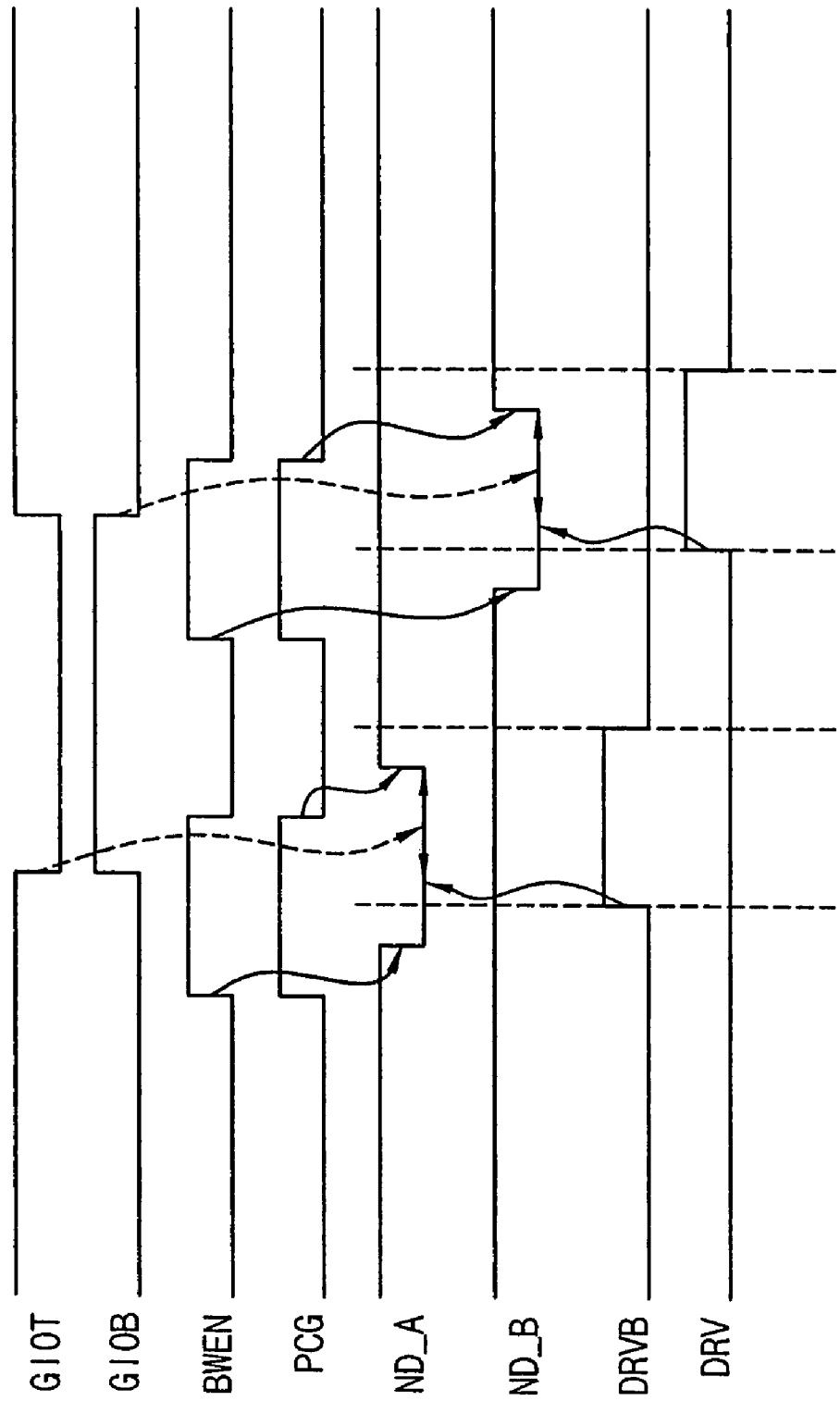
FIG. 8 is a waveform view for explaining the operation of the single-type latch-based write driver control unit (200) shown in FIG. 7.

For example, as shown in FIG. 8, when the write driver enable signal BWEN is delayed and input, the write driver enable signal BWEN may be maintained in an enable state at a point of time at which the global input/output true line GIOT is transited from a high level to a low level.

In this case, since the single type latch-based write driver control unit 200 of FIG. 7 is latching the electric potential of the node ND_A from a point of time at which the inverted driver signal DRVB is enabled, the node ND_A is not floating.

That is, when the write driver enable signal BWEN is enabled while the global input/output true line GIOT is in the high level, the node ND_A goes into a low level, and the inverted driver signal DRVB goes into a high level.

When the inverted driver signal DRVB goes into the high level, the NMOS transistor N18 is turned on, thereby lowering the electric potential of the node ND_A to the level of the ground voltage VSS. In addition, the node ND_A is latched to a low level by the inverter INV13 and NMOS transistor N18.

Therefore, although the global input/output true line GIOT is transited from a high level to a low level, the electric potential of the node ND_A is maintained in the low level, thereby obtaining the effect of preventing the node ND_A from floating.

Similarly, when the write driver enable signal BWEN is delayed and input, and thus the write driver enable signal BWEN is maintained in an enable state at a point of time at which the global input/output bar line GIOB is transited from a high level to a low level, the electric potential of the node ND_B is latched by the inverter INV15 and NMOS transistor N19 from a point of time at which the driver signal DRV is enabled, thereby obtaining the effect of preventing the node ND_B from floating.

As described above, the single type latch-based write driver control unit 200 of FIG. 7 receives the driver signal DRV and inverted driver signal DRVB and latches the nodes ND_A and ND_B, thereby additionally providing a function of preventing the output nodes ND_A and ND_B of the single type latch section 220 from floating due to a delayed input of the write driver enable signal BWEN.

Figure 9:
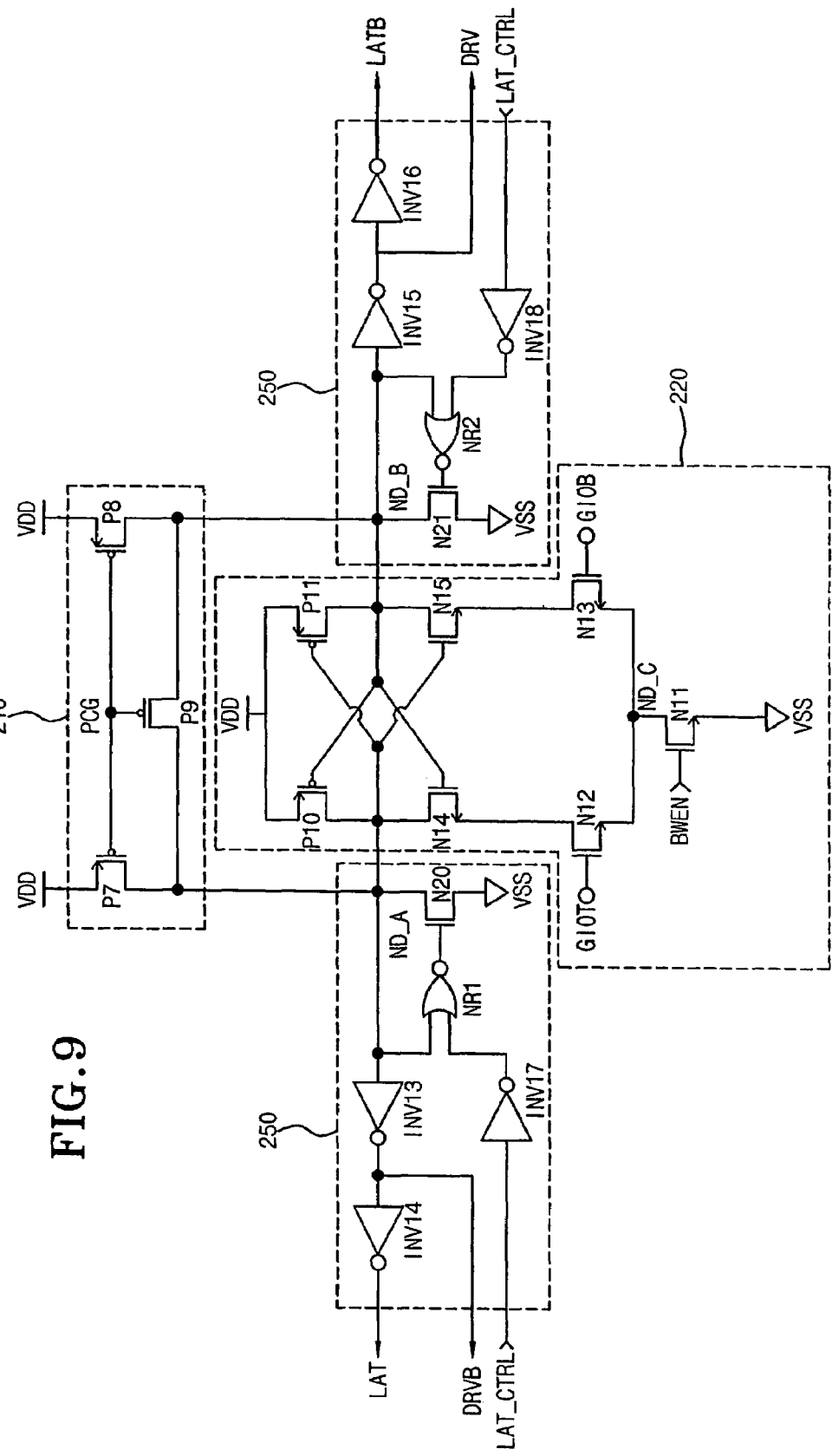
FIG. 9 is a circuit diagram illustrating still another example of the construction of the single-type latch-based write driver control unit (200) shown in FIG. 3.

In addition, the single type latch-based write driver control unit 200 may be configured as shown in FIG. 9.

Referring to FIG. 9, similarly, the single type latch-based write driver control unit 200 has a construction such that a latch-based output section 250 is connected to the output nodes ND_A and ND_B of the single type latch section 220, in addition to the construction of the precharge controller 210 and single type latch section 220 of FIG. 4.

Herein, the latch-based output section 250 may include inverter INV13, inverter INV14, inverter INV17, NOR gate NR1, inverter INV15, inverter INV16, inverter INV18, NOR gate NR2 and two pull-down component. Preferably, each of the pull-up components includes NMOS transistor N20 and NMOS transistor N21. The inverter INV13 inverts the electric potential of the node ND_A, thereby outputting an inverted driver signal DRVB. The inverter INV14 inverts the inverted driver signal DRVB outputted from the inverter INV13, thereby outputting a latch signal LAT. The inverter INV 17 inverts a latch control signal LAT_CTRL. The NOR gate NR1 performs a NOR combination operation with respect to the electric potential of the node NOD_A and an output signal of the inverter INV17. The NMOS transistor N20 is turned on by an output signal of the NOR gate NR1 and lowers the electric potential of the node ND_A to the level of the ground voltage VSS. The inverter INV15 inverts the electric potential of the node ND_B, thereby outputting a driver signal DRV. The inverter INV16 inverts the driver signal DRV outputted from the inverter INV15, thereby outputting an inverted latch signal LATB. The inverter INV 18 inverts the latch control signal LAT_CTRL. The NOR gate NR2 performs a NOR combination operation with respect to the electric potential of the node NOD_B and an output signal of the inverter INV18. The NMOS transistor N21 is turned on by an output signal of the NOR gate NR2 and lowers the electric potential of the node ND_B to the level of the ground voltage VSS. In this case, the write driver enables signal BWEN or precharge control signal PCG may be used as the latch control signal LAT_CTRL.

According to the latch-based output section 250 having such a construction, similarly, when the write driver enable signal BWEN is delayed and input, and is thus maintained in an enable state at a point of time at which the levels of the global input/output lines GIOT and GIOB are transited, the electric potentials of the output nodes ND_A of ND_B of the single type latch section 220 are latched while the write driver enable signal BWEN or precharge control signal PCG is maintained at the enable state, thereby preventing the nodes ND_A of ND_B from floating.

As described above, according to the present invention, the circuit for controlling the write driver is constructed in a single type latch-based structure, thereby reducing the area occupied by the write driver control circuit in a semiconductor memory device.

In addition, according to the present invention, the circuit connected in a single type latch-based structure is used to latch input data and to control the write driver, thereby reducing current consumption in a write operation.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A single type latch-based write driver control circuit for controlling an operation of a write driver, which amplifies and transmits data of a pair of global input/output lines to a pair of local input/output lines in a write operation, the single type latch-based write driver control circuit comprising:

a single type latch section, in a write operation, configured to compare states of first and second data of the pair of global input/output lines having been differentially inputted in a first status and then outputting a first output signal to a first output node, comparing states of the first and second data having been differentially inputted in a second status and then outputting a second output signal to a second output node, and continuously latching states of the first and second output nodes before a precharge operation starts;

a precharge controller configured to equalize and precharge the first and second output nodes in the precharge operation; and an output section configured to output first and second driver signals and first and second latch signals configured to control a write driver, by using the first and second output signals.

2. The write driver control circuit as claimed in claim 1, wherein the single type latch section compares first data of a high level and second data of a low level, which are data in the first status, and outputs the first output signal; and compares first data of a low level and second data of a high level, which are data in the second status, and outputs the second output signal.

3. The write driver control circuit as claimed in claim 2, wherein the single type latch section has a cross-coupled latch structure to output the first and second output signals by comparing electric potentials of the first and second data, and to latch states of the first and second output nodes.

4. The write driver control circuit as claimed in claim 3, wherein the single type latch section comprises:

a pull-down component which is turned on by a write driver control signal enabled in the write operation and pulls down an electric potential of a common node to a ground voltage level;
a first switch which is turned on by the first data and connects a first node with the common node;
a second switch which is turned on by the second data and connects a second node with the common node;
a first pull-up component which is turned on by an electric potential of the second output node and pulls up an electric potential of the first output node to a power supply voltage level;
a third switch which is turned on by the electric potential of the second output node and connects the first output node with the first node;
a second pull-up component which is turned on by the electric potential of the first output node and pulls up the electric potential of the second output node to the power supply voltage level; and
a fourth switch which is turned on by the electric potential of the first output node and connects the second output node with the second node,
wherein the single type latch section outputs the first and second driver signals and the first and second latch signals as driver control signals through the first and second output nodes.

5. The write driver control circuit as claimed in claim 4, wherein the pull-down component and the first to fourth switch include NMOS transistors, and the first and second pull-up component include PMOS transistors.

6. The write driver control circuit as claimed in claim 1, wherein the precharge controller comprises:
    a third pull-up component which is turned on by a precharge control signal enabled in the precharge operation and pulls up an electric potential of the first output node to a power supply voltage level;
    a fourth pull-up component which is turned on by the precharge control signal and pulls up an electric potential of the second output node to the power supply voltage level; and
    a fifth switching component which is turned on by the precharge control signal and equalizes the first output node with the second output node.

7. The write driver control circuit as claimed in claim 6, wherein the third and fourth pull-up components and the fifth switch include PMOS transistors.

8. The write driver control circuit as claimed in claim 1, wherein the output section comprises:
    a first inverter configured to invert the first output signal and configured to output the inverted first output signal as the first driver signal;
    a second inverter configured to invert the first driver signal and configured to output the inverted first driver signal as the first latch signal;
    a third inverter configured to invert the second output signal and configured to output the inverted second output signal as the second driver signal; and
    a fourth inverter configured to invert the second driver signal and configured to output the inverted second driver signal as the second latch signal.

9. A semiconductor memory device comprising:
a buffer unit configured to buffer and transmit data, which have been inputted from an exterior, to a pair of global input/output lines;
a single type latch-based write driver control unit configured to sense, amplify and output a potential difference between data, which have been transferred from the pair of global input/output lines, as driver control signals in the write operation, continuously latching states of the driver control signals before a precharge operation starts, and precharging the driver control signals in the precharge operation;
a write driver configured to drive a pair of local input/output lines by using the driver control signals; and
a column selection unit configured to transmit data of the pair of local input/output lines to a corresponding pair of bit lines with a column selection signal.

10. The semiconductor memory device as claimed in claim 9, wherein the single type latch-based write driver control unit comprises:
    a single type latch section, in a write operation, configured to compare states of first and second data of the pair of global input/output lines having been differentially inputted in a first status and then outputting a first output signal to a first output node, comparing states of the first and second data having been differentially inputted in a second status and then outputting a second output signal to a second output node, and continuously latching states of the first and second output nodes before the precharge operation starts;
    a precharge controller configured to equalize and precharge the first and second output nodes in the precharge operation; and
    an output section configured to output first and second driver signals and first and second latch signals as the write driver control signals, by using the first and second output signals.

11. The semiconductor memory device as claimed in claim 10, wherein the single type latch section compares first data of a high level and second data of a low level, which are data in the first status, and outputs the first output signal; and compares first data of a low level and second data of a high level, which are data in the second status, and outputs the second output signal.

12. The semiconductor memory device as claimed in claim 11, wherein the single type latch-based write driver control unit comprises:
    a single type latch section has a cross-coupled latch structure to output the first and second output signals by comparing electric potentials of the first and second data, and to latch states of the first and second output nodes.

13. The semiconductor memory device as claimed in claim 12, wherein the single type latch section comprises:
    a first pull-down component which is turned on by a write driver control signal enabled in the write operation and pulls down an electric potential of a common node to a ground voltage level;
    a first switch which is turned on by the first data and connects a first node with the common node;
    a second switch which is turned on by the second data and connects a second node with the common node;
    a first pull-up component which is turned on by an electric potential of the second output node and pulls up an electric potential of the first output node to a power supply voltage level;
    a third switch which is turned on by the electric potential of the second output node and connects the first output node with the first node;
    a second pull-up component which is turned on by the electric potential of the first output node and pulls up the electric potential of the second output node to the power supply voltage level; and a fourth switch which is turned on by the electric potential of the first output node and connects the second output node with the second node, wherein the single type latch section outputs the driver control signals through the first and second output nodes.

14. The semiconductor memory device as claimed in claim 13, wherein the single type latch section comprises:

a first pull-down component and the first to fourth switch include NMOS transistors; and the first and second pull-up components include PMOS transistors.

15. The semiconductor memory device as claimed in claim 10, wherein the precharge controller comprises:

a third pull-up component which is turned on by a precharge control signal enabled in the precharge operation and pulls up an electric potential of the first output node to a power supply voltage level;

a fourth pull-up component which is turned on by the precharge control signal and pulls up an electric potential of the second output node to the power supply voltage level; and a fifth switch which is turned on by the precharge control signal and equalizes the first output node with the second output node.

16. The semiconductor memory device as claimed in claim 15, wherein the third and fourth pull-up components and the fifth switch include PMOS transistors.

17. The semiconductor memory device as claimed in claim 10, wherein the output section further comprises:

a first inverter configured to invert the first output signal and configured to output the inverted first output signal as the first driver signal;

a second inverter configured to invert the first driver signal and configured to output the inverted first driver signal as the first latch signal;

a third inverter configured to invert the second output signal and configured to output the inverted second output signal as the second driver signal; and a fourth inverter configured to invert the second driver signal and configured to output the inverted second driver signal as the second latch signal.

18. The semiconductor memory device as claimed in claim 9 or 10, wherein the write driver comprises:

a second pull-down component which is turned on by the first driver signal and pulls down a first local input/output line of the pair of local input/output lines to a ground voltage level;

a fifth pull-up component which is turned on by the first latch signal and pulls up the first local input/output line to a power supply voltage level;

a sixth pull-up component which is turned on by the second driver signal and pulls up a second local input/output line of the pair of local input/output lines to the power supply voltage level; and a third pull-down component which is turned on by the second latch signal and pulls downs the second local input/output line to the ground voltage level.

19. The semiconductor memory device as claimed in claim 18, wherein each of the second and third pull down components includes an NMOS transistor, and each of the fifth and sixth pull-up components includes a PMOS transistor.

20. A method for controlling a write driver, which amplifies and transmits data of a pair of global input/output lines to a pair of local input/output lines in a write operation, the method comprising the steps of:

comparing states of first and second data of the pair of global input/output lines, which have been differentially inputted in the write operation and have a first status, and outputting a first output signal to a first output node;

comparing states of the first and second data which have been differentially inputted and have a second status, and outputting a second output signal to a second output node;

continuously latching states of the first and second output nodes before a precharge operation starts;

equalizing and precharging the first and second output nodes in the precharge operation; and controlling the write driver by using the first and second output signals.

21. The method as claimed in claim 20, wherein, in the step of comparing states of first and second data of the pair of global input/output lines, the first data of a high level and the second data of a low level, which are data in the first status, are compared to each other and the first output signal is outputted; and the first data of a low level and the second data of a high level, which are data in the second status, are compared to each other, and the second output signal is outputted.

* * * * *